(12) United States Patent
Ozawa

(10) Patent No.: US 6,472,234 B2
(45) Date of Patent: Oct. 29, 2002

(54) FAILURE ANALYSIS METHOD FOR CHIP OF BALL GRID ARRAY TYPE SEMICONDUCTOR DEVICE

(75) Inventor: Tadashi Ozawa, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/822,368

(22) Filed: Apr. 2, 2001

(65) Prior Publication Data
US 2002/0013009 A1 Jan. 31, 2002

(30) Foreign Application Priority Data

Apr. 6, 2000 (JP) ......................................... 2000-104457

(51) Int. Cl.[7] ........................... G01R 31/26; H01L 21/66
(52) U.S. Cl. ............................. 438/14; 438/15; 257/778
(58) Field of Search ............................. 257/778; 438/14, 438/15

(56) References Cited

U.S. PATENT DOCUMENTS

| | | | | |
|---|---|---|---|---|
| 5,904,489 A | * | 5/1999 | Khosropour et al. | 438/15 |
| 6,117,352 A | * | 9/2000 | Weaver et al. | 216/105 |
| 6,245,586 B1 | * | 6/2001 | Colvin | 438/15 |

* cited by examiner

Primary Examiner—Richard Elms
Assistant Examiner—Christian D. Wilson
(74) Attorney, Agent, or Firm—Young & Thompson

(57) ABSTRACT

In a failure analysis method for a ball grid array type semiconductor device including a semiconductor chip having pads, first solder balls, an interposer substrate and second solder balls, the second solder balls and the interposer substrate are removed from the semiconductor device, and then, the first solder balls are removed from the semiconductor device. Then, the semiconductor device is mounted on a package, and a wire bonding operation is performed between the pads of the semiconductor chip and bonding pads of the package. Finally, a test operation is performed upon the semiconductor chip by mounting the package on a tester.

13 Claims, 15 Drawing Sheets

FAILURE ANALYSIS METHOD FOR CHIP OF BALL GRID ARRAY TYPE SEMICONDUCTOR DEVICE

BACKGROUND OF THE INVENTION

1. Field of the Invention

The present invention relates to a failure analysis method for a ball grid array (BGA)-type semiconductor device including a bare chip (flip-chip type semiconductor chip).

2. Description of the Related Art

A BGA-type semiconductor device is typically constructed by a flip-chip type semiconductor chip having pads, micro solder bumps formed on the pads, an interposer substrate formed on the micro solder bumps and solder balls formed on the interposer substrate. Additionally, a heat spreader is mounted on the back surface of the semiconductor chip.

Although it is possible to determine whether the above-mentioned BGA-type semiconductor device is normal or defective, it is impossible to perform a failure analysis operation upon the BGA-type semiconductor device, particularly, the semiconductor chip, since the semiconductor chip faces down.

Note that, after BGA-type semiconductor devices are shipped, customers may request a failure analysis operation on failed BGA-type semiconductor devices. In this failure analysis operation, it is impossible to accurately detect a failure due to the above-mentioned fact that the semiconductor chip is facing down.

SUMMARY OF THE INVENTION

It is an object of the present invention to provide a failure analysis method for a BGA-type semiconductor device capable of accurately detecting a failure in a flip-chip type semiconductor chip therein.

According to the present invention, in a failure analysis method for a BGA type semiconductor device comprising a semiconductor chip having pads, first solder balls, an interposer substrate and second solder balls, the second solder balls and the interposer substrate are removed from the semiconductor device, and then, the first solder balls are removed from the semiconductor device. Then, the semiconductor device is mounted on a package, and a wire bonding operation is performed between the pads of the semiconductor chip and bonding pads of the package. Finally, a test operation is performed upon the semiconductor chip by mounting the package on a tester.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
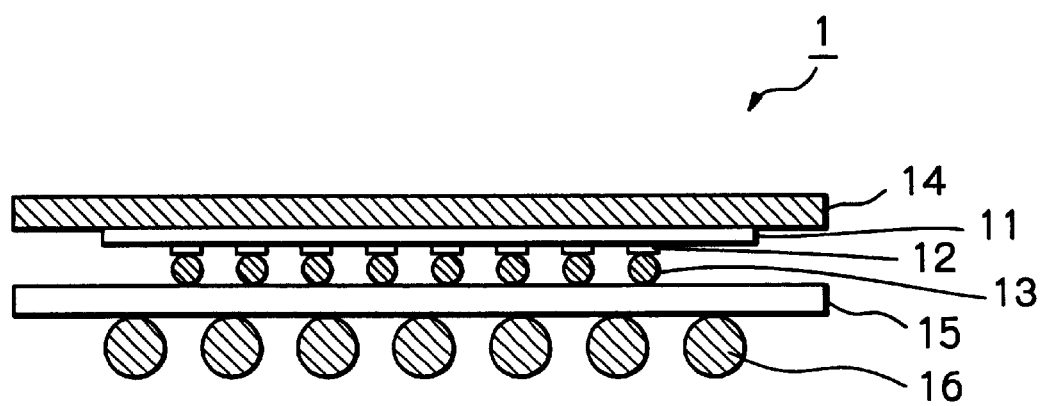
FIG. 1 is a cross-sectional view illustrating a semiconductor device to which the present invention is applied.

In FIG. 1, which illustrates a BGA-type semiconductor device 1 to which the present invention is applied, reference numeral 11 designates a flip-chip type semiconductor chip on which pads 12 are formed. Also, micro solder balls 13 are provided on the bonding pads 12.

Additionally, a heat spreader 14 is adhered to the back surface of the semiconductor chip 11 for cooling.

Further, the front surface of the semiconductor chip 11 is mounted on a first surface of an interposer substrate 15 made of ceramic or organic material by an ultrasonic pushing tool. On the other hand, solder bumps 16 are provided on a second surface of the interposer substrate 5.

Note that the entire device 1 of FIG. 1 is molded by resin (not shown).

Figure 2A:
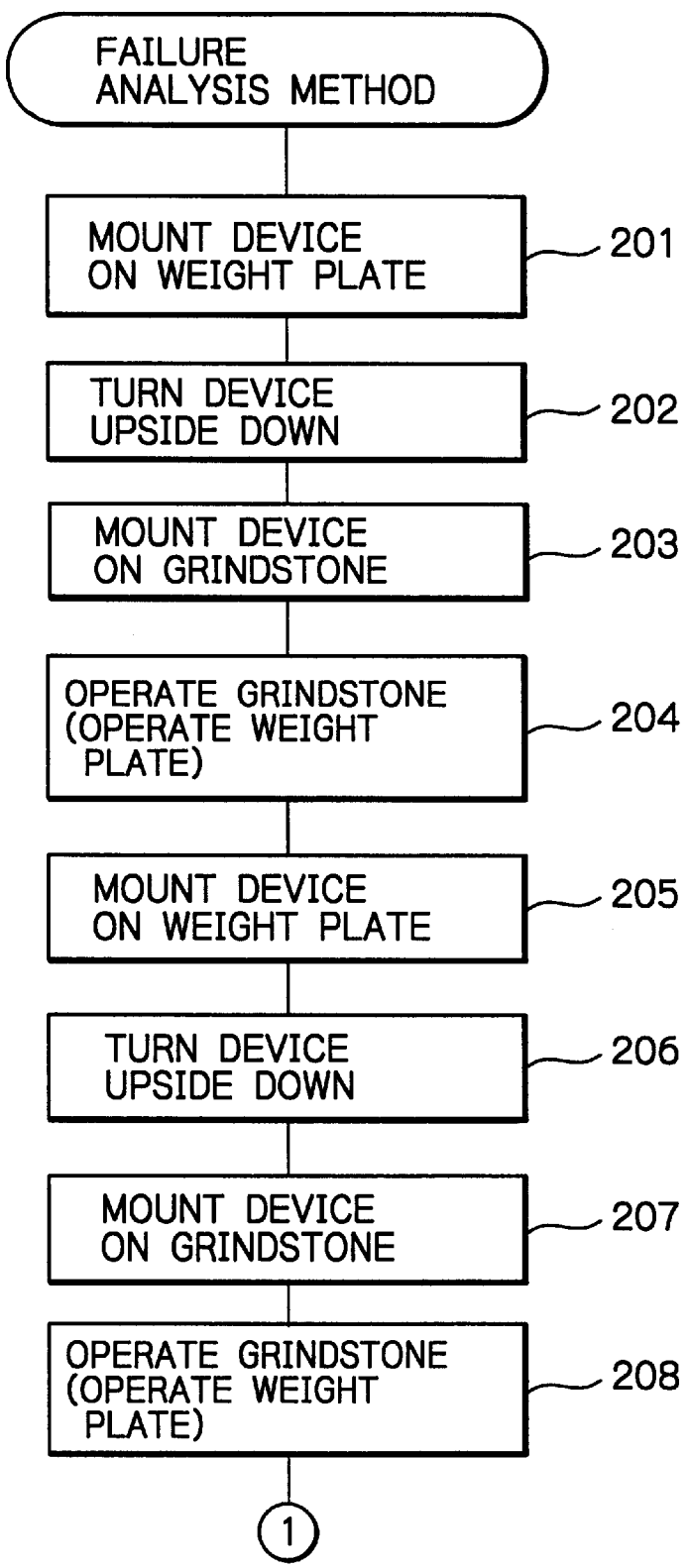
FIGS. 2A and 2B are flowcharts for explaining a first embodiment of the failure analysis method according to the present invention.
Figure 2B:
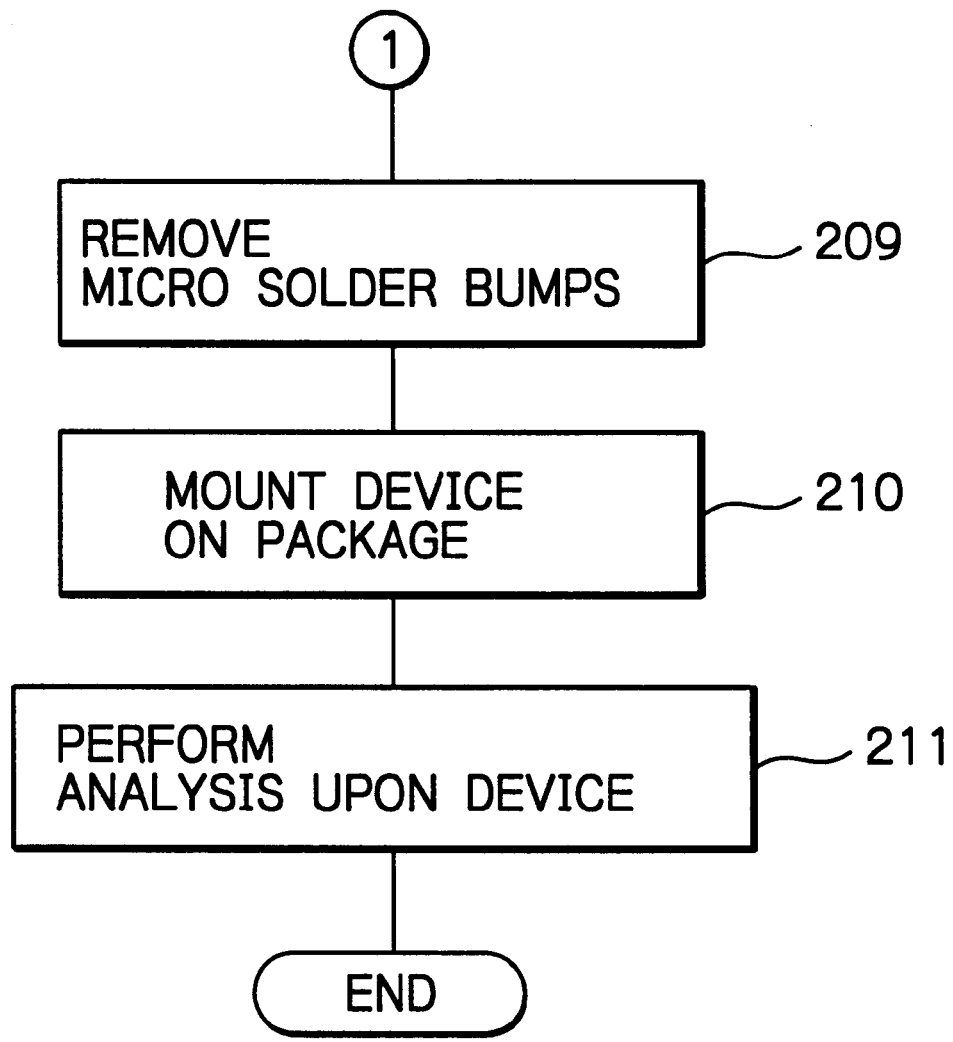

A first embodiment of the failure analysis method according to the present invention will be explained next with reference to FIGS. 2A and 2B as well as FIGS. 3A through 3K.

Figure 3A:
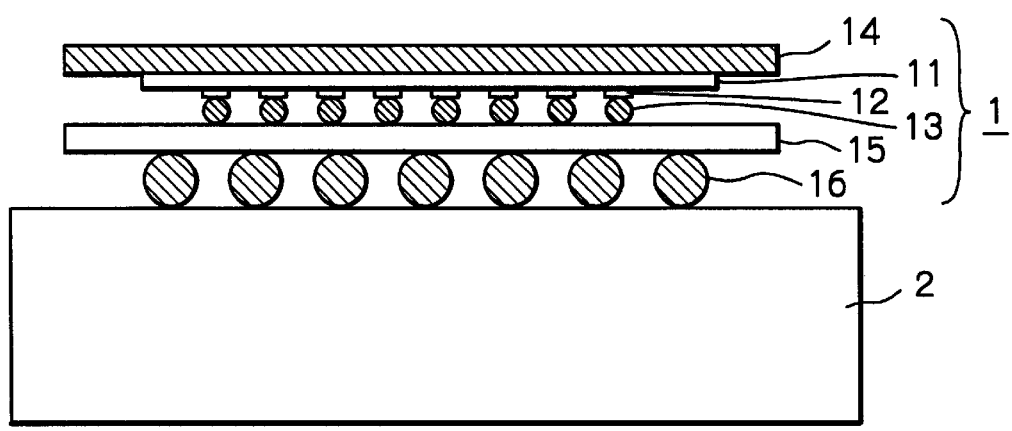
FIGS. 3A through 3K are cross-sectional views for explaining the steps of the flowchart of FIGS. 2A and 2B.

First, at step 201, as illustrated in FIG. 3A, the device 1 of FIG. 1 is faced down on a weight plate 2 made of metal alloy, and is fixed to the weight plate 2 by a brazing method at a temperature of about 100° C.

Figure 3B:
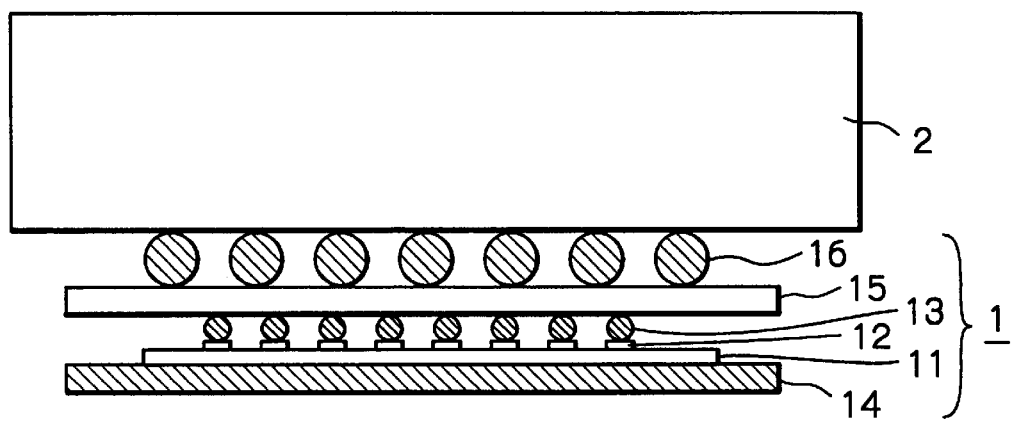

Next, at step 202, as illustrated in FIG. 3B, the device 1 is turned upside down.

Figure 3C:
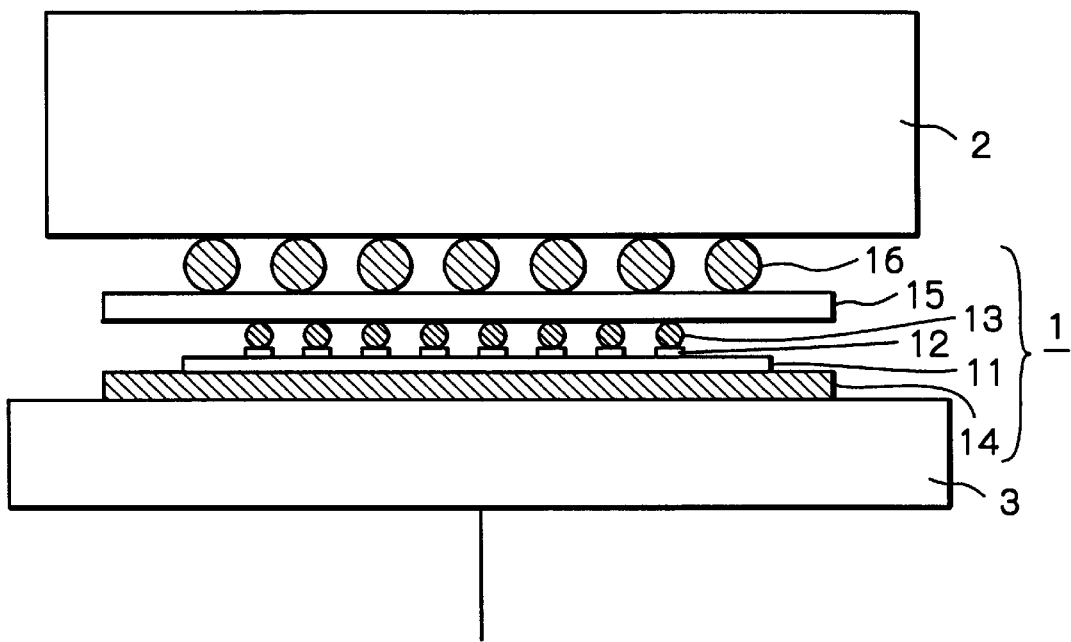

Next, at step 203, as illustrated in FIG. 3C, the device 1 is mounted on a grindstone 3 which is circular or rectangular, so that the heat spreader 14 is in contact with the grindstone 3.

Figure 3D:
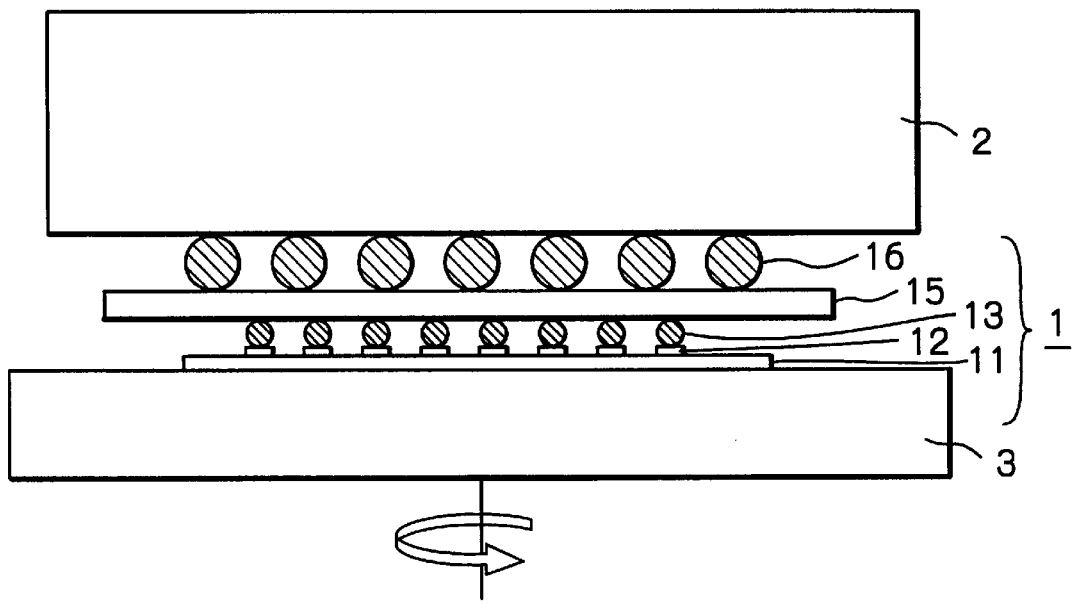

Next, at step 204, as illustrated in FIG. 3D, the grindstone 3 is operated by pressurizing the weight plate 2. In this case, if the grindstone 3 is circular, the grindstone 3 is rotated. On the other hand, if the grindstone 3 is rectangular, the grindstone 3 is reciprocated. As a result, the heat spreader 14 is removed to expose the semiconductor chip 11.

Note that, at step 204, the weight plate 2 can be operated, i.e., rotated or reciprocated while the grindstone 3 is fixed.

Then, the weight plate 2 is separated from the solder bumps 16 by heating the weight plate 2 to a temperature of about 100° C.

Figure 3E:
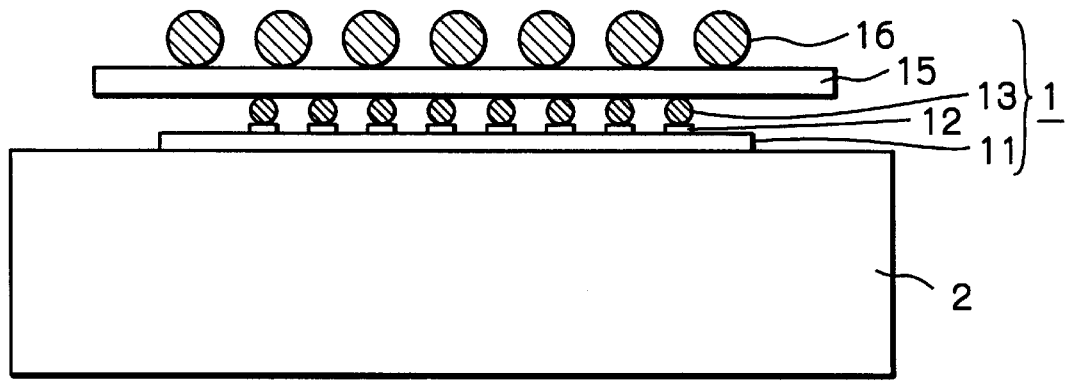

Next, at step 205, as illustrated in FIG. 3E, the device 1 is faced up on the weight plate 2, and is fixed to the weight plate 2 by a brazing method at a temperature of about 100° C.

Figure 3F:
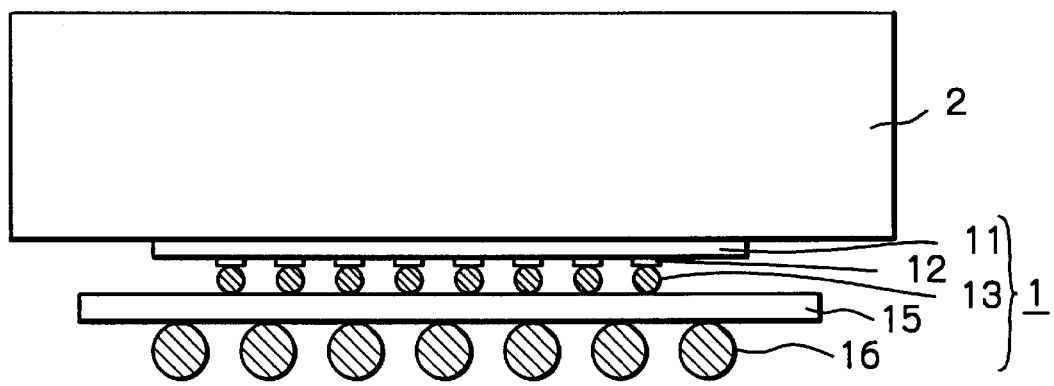

Next, at step 206, as illustrated in FIG. 3F, the device 1 is turned upside down.

Figure 3G:
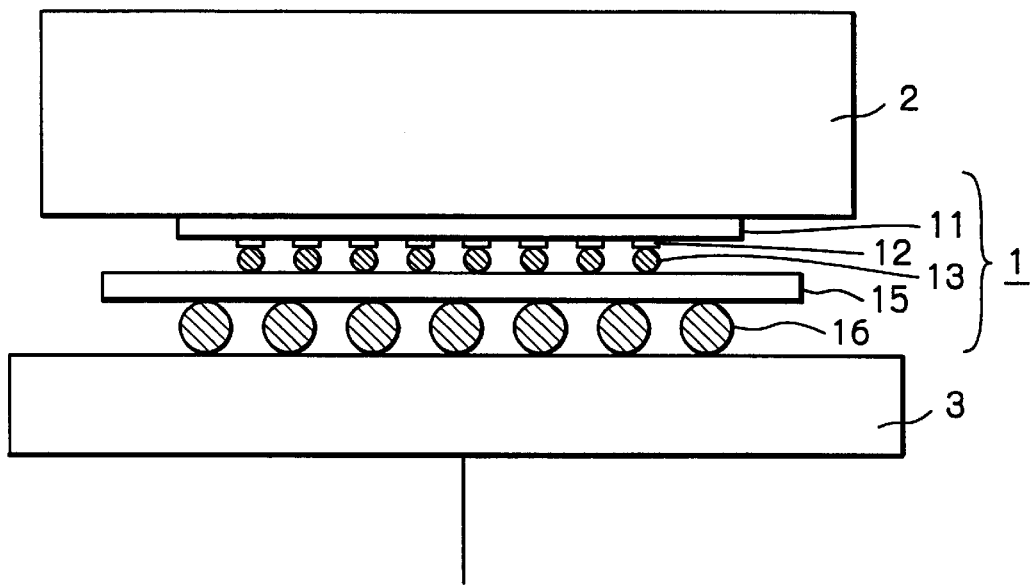

Next, at step 207, as illustrated in FIG. 3G, the device 1 is mounted on the grindstone 3, so that the solder bumps 16 are in contact with the grindstone 3.

Figure 3H:
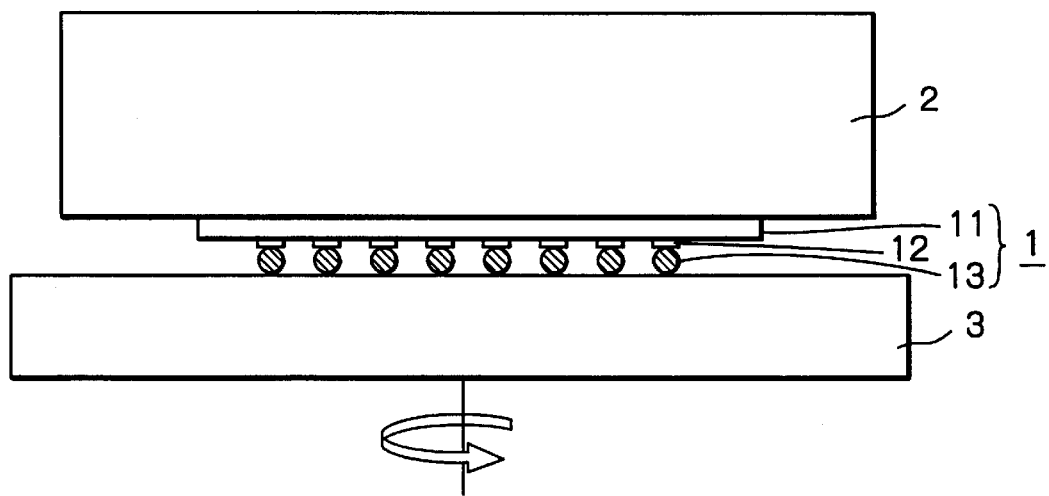

Next, at step 208, as illustrated in FIG. 3H, the grindstone 3 is operated by pressurizing the weight plate 2. In this case, if the grindstone 3 is circular, the grindstone 3 is rotated. On the other hand, if the grindstone 3 is rectangular, the grindstone 3 is reciprocated. As a result, the solder bumps 16 and the interposer substrate 15 are removed to expose the micro solder bumps 13.

Note that, even at step 208, the weight plate 2 can be operated, i.e., rotated or reciprocated while the grindstone 3 is fixed.

Then, the weight plate 2 is separated from the micro solder bumps 13 by heating the weight plate 2 to a temperature of about 100° C.

Figure 3I:
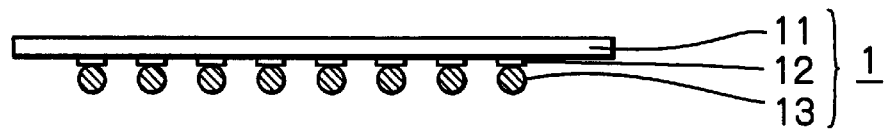

Thus, as illustrated in FIG. 3I, the device 1 is constructed by only the semiconductor chip 11, the pads 12 and the micro solder bumps 13.

Figure 3J:

Next, at step 209, as illustrated in FIG. 3J, the micro solder bumps 13 are removed. In this case, since the micro solder bumps 13 are adhered via alloy reaction preventing metal such as Cu/TiW to the pads 12, the micro solder bumps 13 can be removed by removing the alloy reaction preventing metal which is dipped into fuming nitric acid.

Figure 3K:
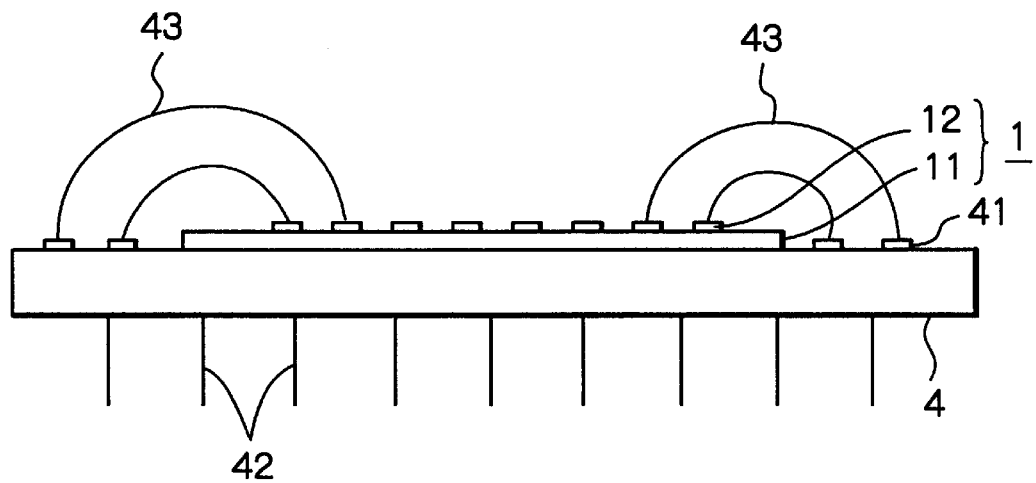

Next, at step 210, as illustrated in FIG. 3K, the device 1 is mounted on a package 4 which has bonding pads 41 on the front surface and electrode pins 42 on the back surface. Then, wires 43 are bonded between the pads 12 and the bonding pads 42. Usually, since only a part of the pads 12 are necessary for a failure analysis operation, the wires 43 are bonded to some of the pads 12.

Finally, at step 211, the package 4 is mounted on a tester (not shown) for carrying out a failure analysis operation.

Thus, the device 1, particularly, the semiconductor chip 11 is subjected to a failure analysis.

Figure 4:
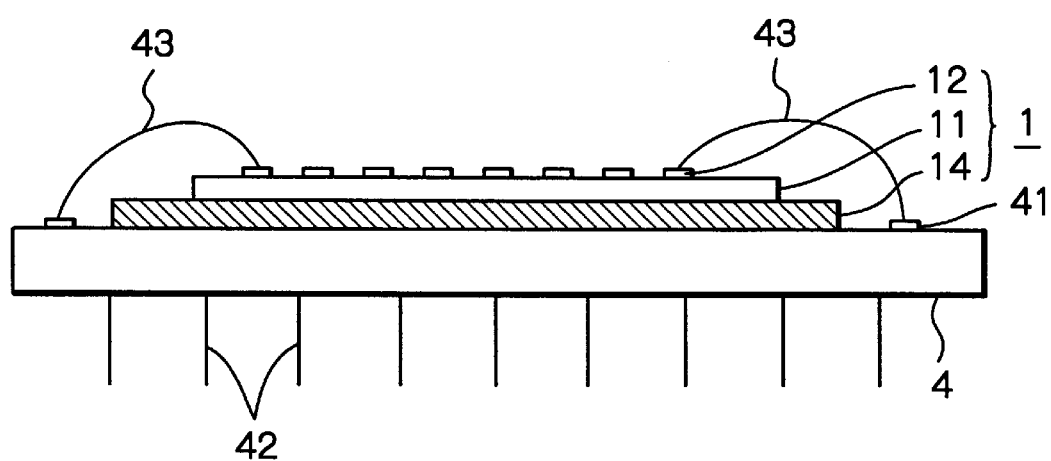
FIG. 4 is a cross-sectional view illustrating a modification of FIG. 3K.

In the above-described first embodiment, the failure analysis operation can be initiated at step 205. In this case, as illustrated in FIG. 4, the semiconductor chip 11 is mounted via the heat spreader 14 on the package 4. Also, if the device 1 is of a low power output type so that the heat spreader 16 is not provided, the failure analysis operation is initiated directly from step 205.

Figure 5A:
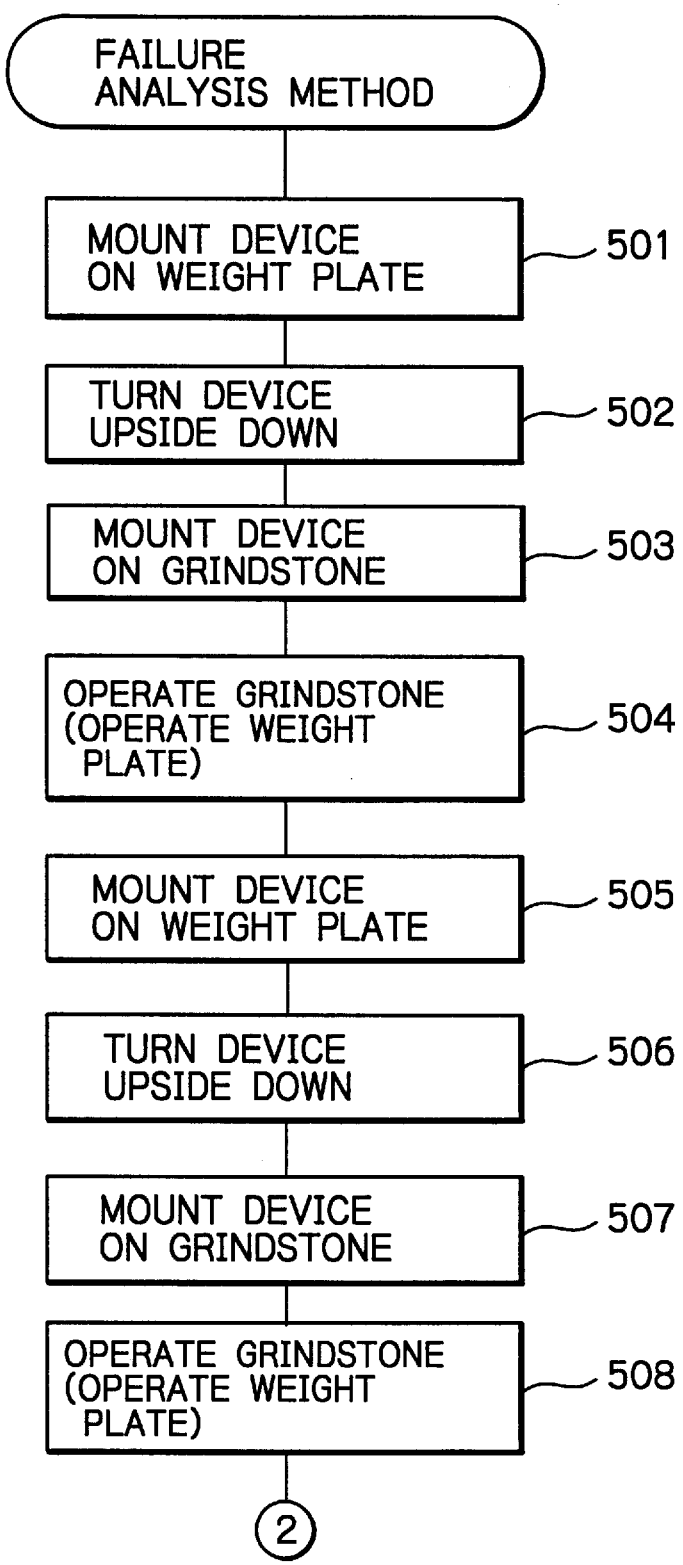
FIGS. 5A and 5B are flowcharts for explaining a second embodiment of the failure analysis method according to the present invention.
Figure 5B:
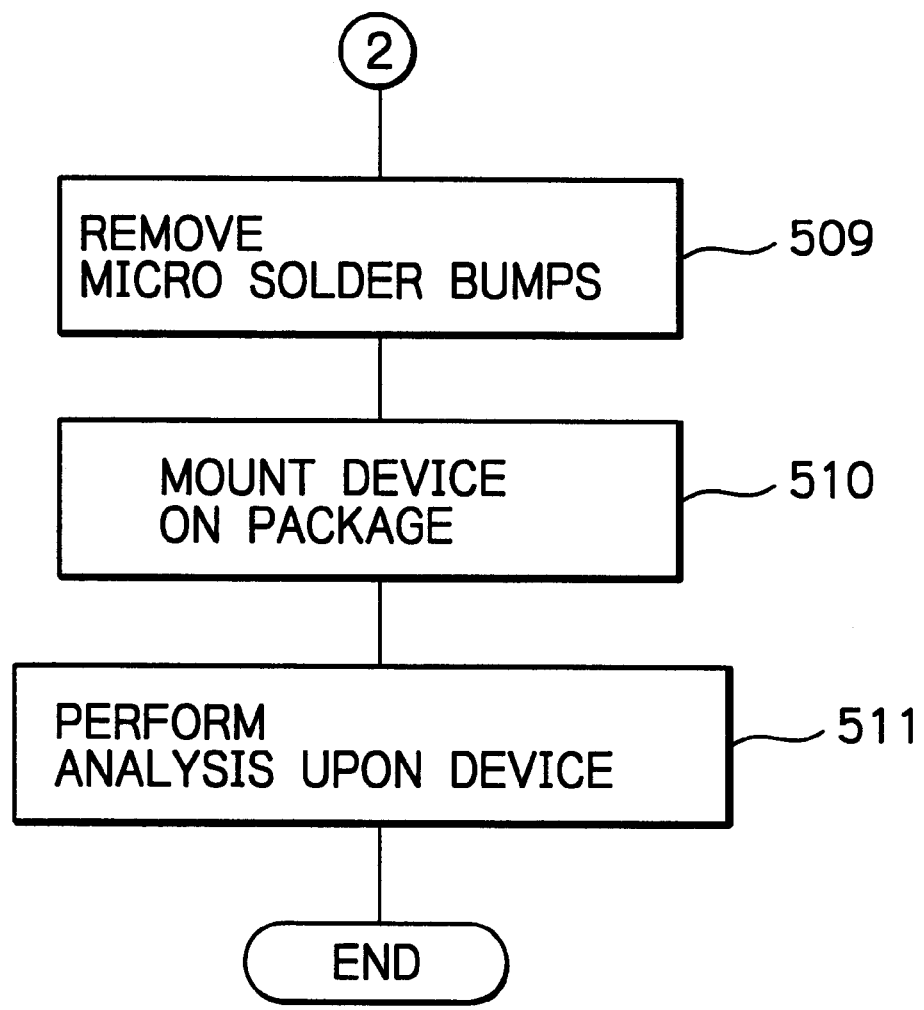

A second embodiment of the failure analysis method according to the present invention will be explained next with reference to FIGS. 5A and 5B as well as FIGS. 6A through 6H.

Figure 6A:
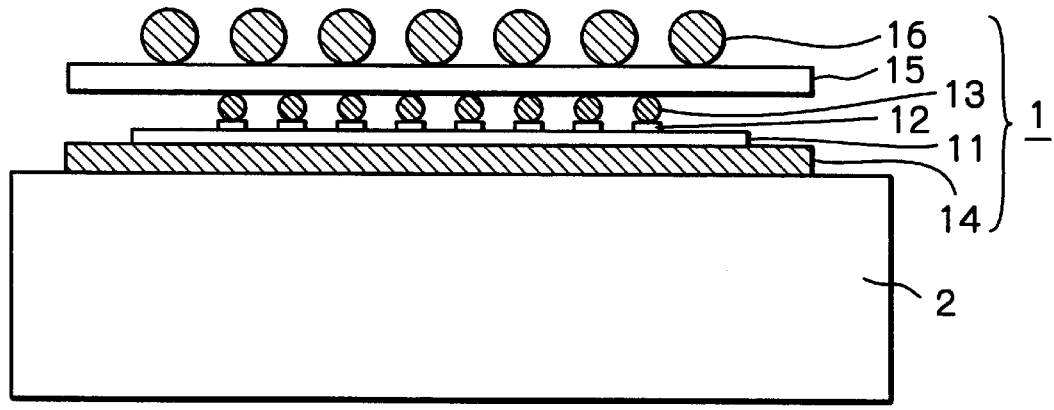
FIGS. 6A through 6H are cross-sectional views for explaining the steps of the flowchart of FIGS. 5A and 5B.

First, at step 501, as illustrated in FIG. 6A, the device 1 of FIG. 1 is faced up on the weight plate 2, and is fixed to the weight plate 2 by a brazing method at a temperature of about 100° C.

Figure 6B:
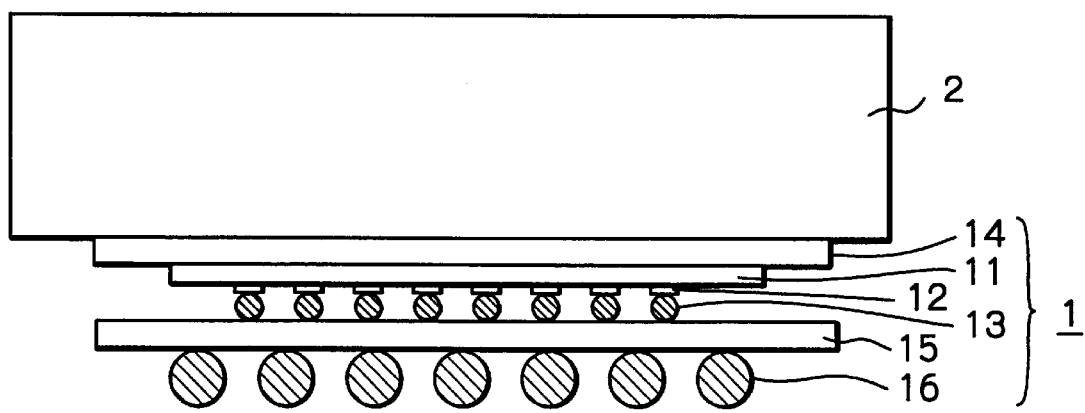

Next, at step 502, as illustrated in FIG. 6B, the device 1 is turned upside down.

Figure 6C:
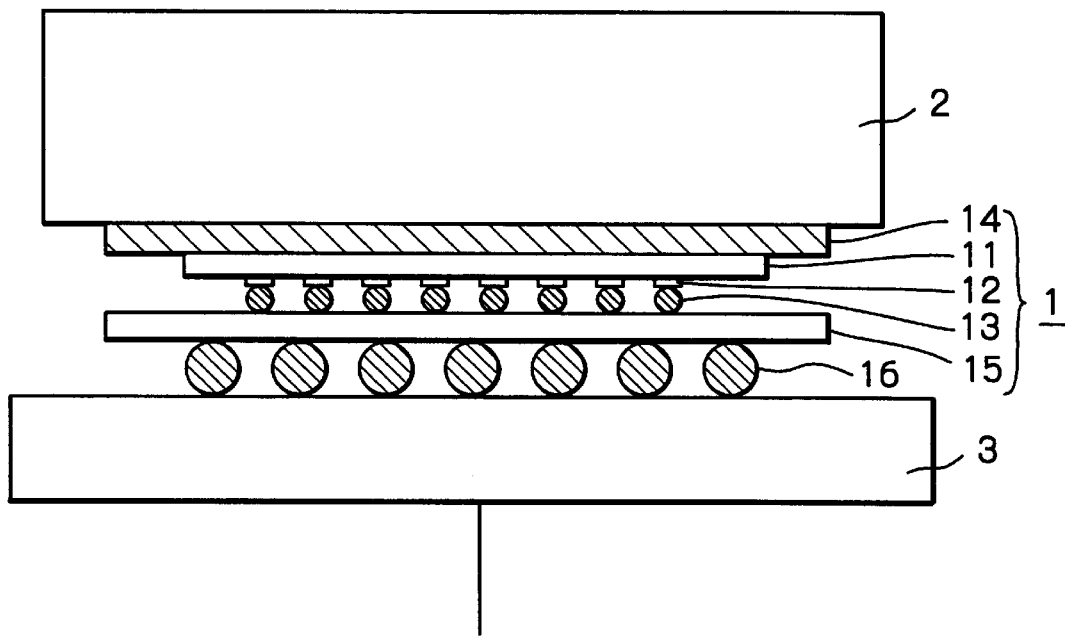

Next, at step 503, as illustrated in FIG. 6C, the device 1 is mounted on the grindstone 3, so that the solder bumps 16 are in contact with the grindstone 3.

Figure 6D:
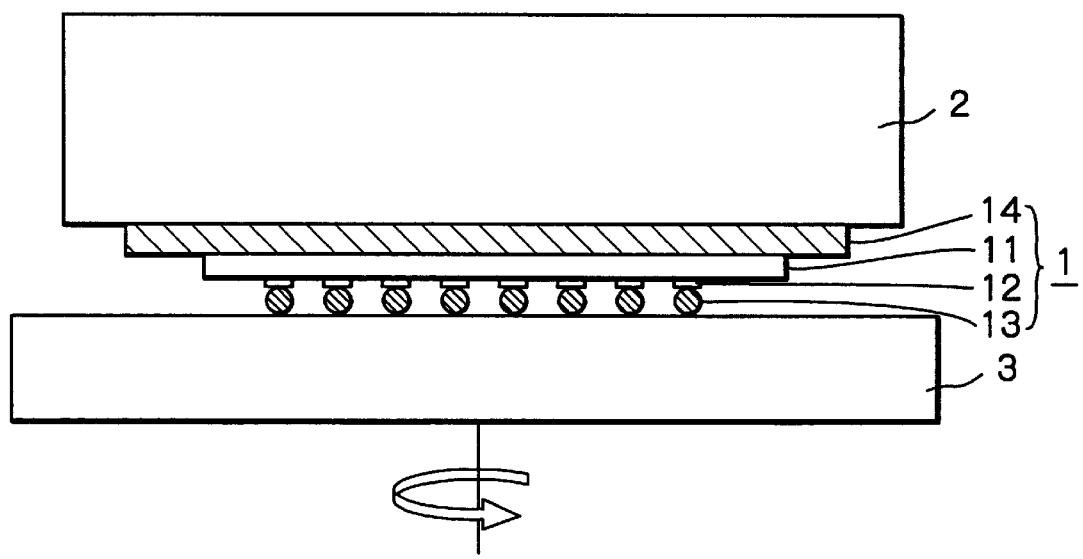

Next, at step 504, as illustrated in FIG. 6D, the grindstone 3 is operated by pressurizing the weight plate 2. In this case, if the grindstone 3 is circular, the grindstone 3 is rotated. On the other hand, if the grindstone 3 is rectangular, the grindstone 3 is reciprocated. As a result, the solder bumps 16 and the interposer 15 are removed to expose the micro solder bumps 13.

Note that, at step 504, the weight plate 2 can be operated, i.e., rotated or reciprocated while the grindstone 3 is fixed.

Then, the weight plate 2 is separated from the micro solder bumps 13 by heating the weight plate 2 to a temperature of about 100° C.

Figure 6E:
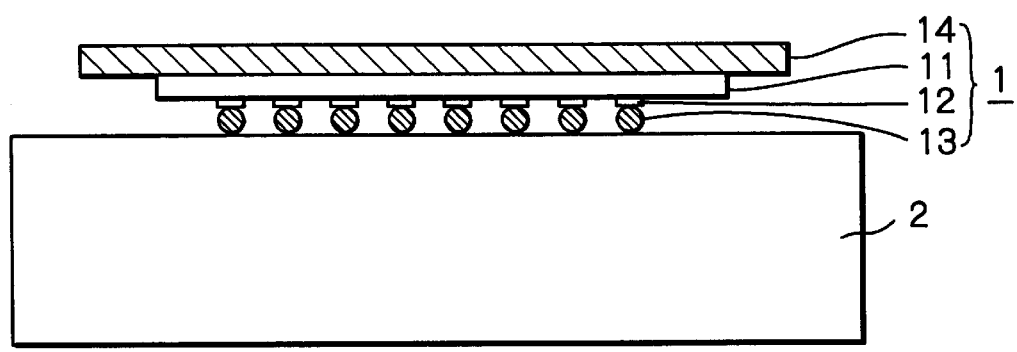

Next, at step 505, as illustrated in FIG. 6E, the device 1 is faced down on the weight plate 2, and is fixed to the weight plate 2 by a brazing method at a temperature of about 100° C.

Figure 6F:
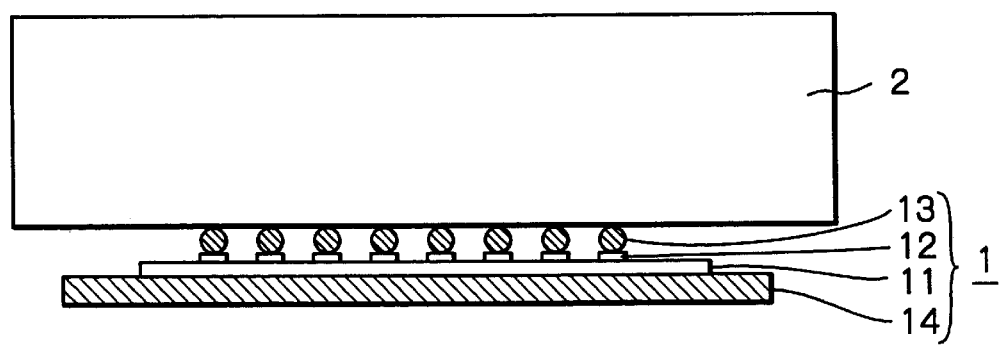

Next, at step 506, as illustrated in FIG. 6F, the device 1 is turned upside down.

Figure 6G:
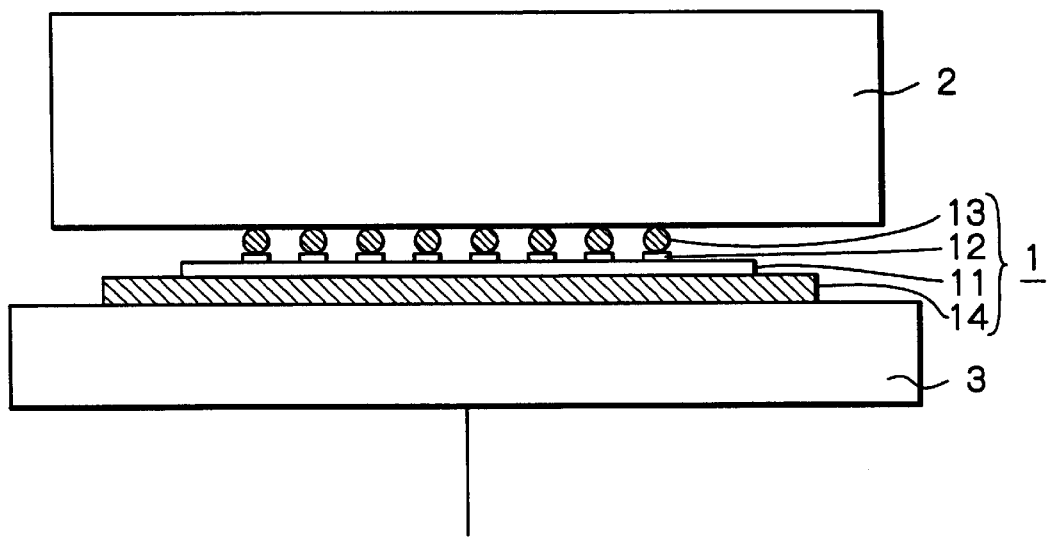

Next, at step 507, as illustrated in FIG. 6G, the device 1 is mounted on the grindstone 3, so that the heat spreader 14 is in contact with the grindstone 3.

Figure 6H:
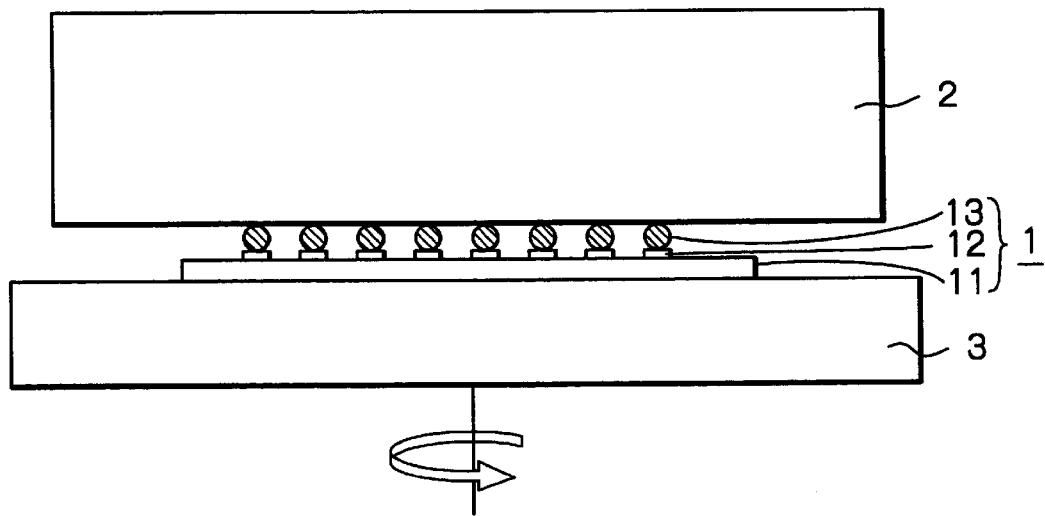

Next, at step 508, as illustrated in FIG. 6H, the grindstone 3 is operated by pressurizing the weight plate 2. In this case, if the grindstone 3 is circular, the grindstone 3 is rotated. On the other hand, if the grindstone 3 is rectangular, the grindstone 3 is reciprocated. As a result, the heat spreader 14 is removed to expose the semiconductor chip 11.

Note that, even at step 508, the weight plate 2 can be operated, i.e., rotated or reciprocated while the grindstone 3 is fixed.

Then, the weight plate 2 is separated from the micro solder bumps 13 by heating the weight plate 2 to a temperature of about 100° C.

Thus, as illustrated in FIG. 3I, the device 1 is constructed by only the semiconductor chip 11, the pads 12 and the micro solder bumps 13.

Next, at steps 509, 510 and 511, the same processes as illustrated at steps 209, 210 and 211 are carried out.

Thus, the device 1, particularly, the semiconductor chip 11 is subjected to a failure analysis.

Even in the above-described second embodiment, the failure analysis operation can be initiated at step 505. In this case, as illustrated in FIG. 4, the semiconductor chip 11 is mounted via the heat spreader 14 on the package 4. Also, if the device 1 is of a low power output type so that the heat spreader 16 is not provided, the failure analysis operation is initiated directly from step 505.

As explained hereinabove, according to the present invention, the fault analysis of flip-chip semiconductor chips packaged in BGA-type semiconductor devices can be surely carried out.

What is claimed is:

1. A failure analysis method for a ball grid array type semiconductor device comprising a semiconductor chip having pads, first solder balls formed on said pads, an interposer substrate formed on said first semiconductor balls and second solder balls formed on said interposer substrate, comprising the steps of:

removing said second solder balls and said interposer substrate from said semiconductor device;

removing said first solder balls from said semiconductor device to expose said pads on a surface of said semiconductor chip, after said second solder balls and said interposer substrate are removed;

mounting said semiconductor device on a package, after said first solder balls are removed and said pads exposed;

performing a wire bonding operation on said pads of said semiconductor chip and on bonding pads of said package to connect bonding wires therebetween; and performing a test operation upon said semiconductor chip by mounting said package on a tester.

2. The method as set forth in claim 1, wherein said second solder balls/interposer substrate removing step comprises the steps of:

adhering a weight plate to a back surface of said semiconductor chip; and grinding said second solder balls and said interposer substrate by a grindstone.

3. The method as set forth in claim 1, wherein said first solder ball removing step comprises a step of dipping said semiconductor device in fuming nitric acid.

4. The method as set forth in claim 1, wherein said semiconductor device comprises a heat spreader adhered on a back surface of said semiconductor chip.

5. The method as set forth in claim 4, wherein said second solder balls/interposer substrate removing step comprises the steps of:

adhering a weight plate to said heat spreader; and grinding said second solder balls and said interposer substrate by a grindstone.

6. A failure analysis method for a ball grid array type semiconductor device comprising a semiconductor chip having pads on a front surface thereof, first solder balls formed on said pads, an interposer substrate formed on said first semiconductor balls, second solder balls formed on said interposer substrate and a heat spreader adhered to a back surface of said semiconductor chip, comprising the steps of:

removing said heat spreader;

removing said second solder balls and said interposer substrate from said semiconductor device, after said heat spreader is removed;

removing said first solder balls from said semiconductor device to expose said pads on a surface of said semiconductor chip, after said second solder balls and said interposer substrate are removed;

mounting said semiconductor device on a package, after said first solder balls are removed and said pads exposed;

performing a wire bonding operation on said pads of said semiconductor chip and bonding pads of said package; and performing a test operation upon said semiconductor chip by mounting said package on a tester.

7. The method as set forth in claim 6, wherein said heat spreader removing step comprises the steps of:

adhering a weight plate to said second solder bumps; and grinding said heat spreader by a grindstone.

8. The method as set forth in claim 6, wherein said second solder balls/interposer substrate removing step comprises the steps of:

adhering a weight plate on the back surface of said semiconductor chip; and grinding said second solder balls and said interposer substrate by a grindstone.

9. The method as set forth in claim 6, wherein said first solder ball removing step comprises a step of dipping said semiconductor device in fuming nitric acid.

10. A failure analysis method for a ball grid array type semiconductor device comprising a semiconductor chip having pads on a front surface thereof, first solder balls formed on said pads, an interposer substrate formed on said first semiconductor balls, second solder balls formed on said interposer substrate and a heat spreader adhered to a back surface of said semiconductor chip, comprising the steps of:

removing said second solder balls and said interposer substrate from said semiconductor device;

removing said heat spreader, after said second solder balls and said interposer substrate;

removing said first solder balls to exposed said pads, after said heat spreader is removed;

mounting said semiconductor device on a package, after said first solder balls are removed;

performing a wire bonding operation on said pads of said semiconductor chip and on bonding pads of said package; and performing a test operation upon said semiconductor chip by mounting said package on a tester.

11. The method as set forth in claim 10, wherein said second solder balls/interposer substrate removing step comprises the steps of:

adhering a weight plate to said heat spreader; and grinding said second solder balls and said interposer substrate by a grindstone.

12. The method as set forth in claim 10, wherein said heat spreader removing step comprises the steps of:

adhering a weight plate to said first solder bumps; and grinding said heat spreader by a grindstone.

13. The method as set forth in claim 10, wherein said first solder ball removing step comprises a step of dipping said semiconductor device in fuming nitric acid.

* * * * *